(12) United States Patent
Kumagai et al.

(10) Patent No.: US 7,419,849 B2
(45) Date of Patent: Sep. 2, 2008

(54) METHOD FOR PRODUCING SINGLE ELECTRON SEMICONDUCTOR ELEMENT

(75) Inventors: Shinya Kumagai, Kyoto (JP); Shigeo Yoshii, Osaka (JP); Nozomu Matsukawa, Nara (JP); Ichiro Yamashita, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/878,691

(22) Filed: Jul. 26, 2007

(65) Prior Publication Data

US 2008/0108227 A1    May 8, 2008

Related U.S. Application Data

(63) Continuation of application No. PCT/JP2006/323730, filed on Nov. 28, 2006.

(30) Foreign Application Priority Data

Feb. 6, 2006   (JP) ............... 2006-028438

(51) Int. Cl.
*H01L 51/40* (2006.01)
(52) U.S. Cl. ............ 438/99; 438/778; 438/780; 438/962; 257/E21.37; 257/E21.452; 977/773
(58) Field of Classification Search .......... 438/316, 438/327, 335, 500, 502, 962; 977/721, 723; 257/E21.094, E21.37, E21.373, E21.376
See application file for complete search history.

(56) References Cited

U.S. PATENT DOCUMENTS 5,997,958 A    12/1999  Sato et al.
6,303,516 B1   10/2001  Morita et al.

(Continued)

FOREIGN PATENT DOCUMENTS

JP            8-78669        3/1996

(Continued)

OTHER PUBLICATIONS

Dutta, A., et al., "Single-Electron Tunneling Devices Based on Silicon Quantum Dots Fabricated by Plasma Process" Japanese Journal of Applied Physics, Jan. 2000, pp. 264-267, vol. 39, Pt. 1, No. 1, Publication Board, Japanese Journal of Applied Physics.

(Continued)

*Primary Examiner*—Scott B. Geyer
*Assistant Examiner*—Cheung Lee
(74) *Attorney, Agent, or Firm*—McDermott Will & Emery LLP

(57) ABSTRACT

The present invention provides a method for production of a single electron semiconductor element (SET) in which a quantum dot is selectively arranged in a nano gap between fine electrodes, whereby the product yield is significantly improved, leading to excellent practical applicability. The method for production of SET of the present invention is characterized in that a solution containing ferritin including a metal or semiconductor particle therein, and a nonionic surfactant is dropped on a substrate having a source electrode and a drain electrode formed by laminating a titanium film and a film of a metal other than titanium, whereby the ferritin is selectively arranged in a nano gap between the source electrode/drain electrode.

9 Claims, 17 Drawing Sheets

U.S. PATENT DOCUMENTS

| | | |
|---|---|---|
| 6,342,716 B1 | 1/2002 | Morita et al. |
| 2005/0139819 A1* | 6/2005 | Hwang et al. ............... 257/14 |
| 2008/0096287 A1* | 4/2008 | Barth ..................... 436/518 |

FOREIGN PATENT DOCUMENTS

| | | |
|---|---|---|
| JP | 10-148943 | 6/1998 |
| JP | 10-321834 | 12/1998 |
| JP | 11-233752 | 8/1999 |
| JP | 2000-349275 | 12/2000 |
| JP | 2001-119038 | 4/2001 |

OTHER PUBLICATIONS

Sato, T., et al., "Single electron transistor using a molecularly linked gold colloidal particle chain", Journal of Applied Physics, Jul. 1997, pp. 696-701, vol. 82, No. 2, American Institute of Physics.

* cited by examiner

↓ To Fig. 6E vapor deposited Ti thin film and Au thin film
27

⇓ To Fig. 6I wiring with FIB (focused ion beam) apparatus

METHOD FOR PRODUCING SINGLE ELECTRON SEMICONDUCTOR ELEMENT

This is a continuation application under U.S.C 111(a) of pending prior International application No. PCT/JP2006/323730, filed on Nov. 28, 2006, which in turn claims the benefit of Japanese Application No. 2006-028438 filed on Feb. 6, 2006, the disclosures of which Application are incorporated by reference herein.

TECHNICAL FIELD

The present invention relates to a method for production of a single electron semiconductor element, in particular, relates to a method for production of a single electron semiconductor element in which a nano dot (quantum dot) composed of a metal or a semiconductor is arranged between a source electrode and a drain electrode.

BACKGROUND ART

In order to increase the degree of integration of semiconductor memory elements, development of novel techniques in production steps has been demanded. When a MOS structure is utilized in semiconductor memory elements, highly integrated semiconductor memory elements such as DRAM of approximately 4 giga, a gap between the source electrode and the drain electrode becomes as small as approximately 0.13 µm. Therefore, it is predicted that switching by gate voltage which has been conventionally utilized as an operation principle of MOS elements is disabled. Hence, small gap between the source electrode and the drain electrode causes malfunctions of the elements may be caused due to phenomena of tunneling through the gate oxide film, and of tunneling between the source electrode and the drain electrode even in the state without applying the gate voltage. Therefore, for manufacture of giga-order or tera-order devices, it is necessary to use modes other than those currently used on the basis of the MOS structure.

As one of the elements of such novel modes, single electron semiconductor elements (also referred to as "Single Electron Transistor", hereinafter, abbreviated as SET) in which a single electron tunnel effect is utilized have been focusing attention.

SET is an element which works on the basis of a phenomenon referred to as coulomb blockade. More specifically, elements that operate depending on alteration of electrostatic energy generated upon tunneling of one electron as a unit between fine conductors which can be charged or discharged are referred to as single electron element. Operation of the same has been confirmed in the form of single electron memories, single electron transistors and the like. Junctions which can result in observation of such a coulomb blockade phenomenon are referred to as fine tunnel junctions.

In conventional SET, fine tunnel junctions have been formed by fine patterning with electron beam lithography (for example, see Nonpatent Document 1 (T. A. Fulton and G. J. Dolan: "Observation of Single-Electron Charging Effects in Small Tunnel Junctions", Phys. Rev. Lett. Vol. 59, No. 1, pp. 109-112 (1987).), however, capacity of the fine tunnel junction which is formable thereby can not make small enough, therefore, operation of SET at a room temperature was difficult. As a matter of fact, for enabling the observation of such a phenomenon referred to as coulomb blockade as described above at a room temperature, alteration of the electrostatic energy should be significantly large as compared with the alteration of thermal energy.

To this end, size of the conductor which can be charged or discharged should be equal to or less than 20 nm, in addition, intervals provided by arranging these conductor which can be charged or discharged should be equal to or less than several nanometers. Such a minute fine tunnel junction can be hardly produced by a pattern formation method according to currently employed lithographic technique. Alternatively, even if it can be produced, production of large quantity in a high yield is extremely difficult.

As a method for production of the SET structural device by arranging nano particles between fine electrodes formed on a substrate, Nonpatent Document 2 (A. Dutta et al.,: "Single-Electron Tunneling Devices Based on Silicon Quantum Dots Fabricated by Plasma Processes", Jpn. J. Appl. Phys. Vol. 39, pp. 264-267 (2000).) discloses a method in which Si nano particles are fixed on a substrate on which fine electrodes (source electrode and drain electrode) are provided, and an Si particle chain is formed in a nano gap between the source electrode and the drain electrode (hereinafter, referred to as nano gap between source/drain).

Also, Nonpatent Document 3 (T. Sato et al.,: "Sigle electron transistor using molecularly linked gold colloidal particle chain", J. Appl. Phys. 82 (2), p 696 (1997).) discloses a method in which an Au nano particle chain is formed in the nano gap between source/drain by allowing Au nano particles to be adsorbed on a substrate on which fine electrodes (source electrode and drain electrode) are formed, then modifying the Au nano particle with dithiol, and further allowing for adsorption of the Au nano particle.

DISCLOSURE OF THE INVENTION

Problems that the Invention is to Solve

However, according to the method disclosed in Nonpatent Document 2 or Nonpatent Document 3, it is difficult to arrange the nano particles selectively in the nano gap between the source electrode and the drain electrode, and it merely utilizes as a quantum dot the nano particle that happened to be arranged in the nano gap.

In other words, according to the method disclosed in Nonpatent Document 2 or Nonpatent Document 3, a large number of quantum dots are formed at random on the substrate on which the fine electrodes are formed. Therefore, as shown in FIG. 14A, it is impossible to regulate the distance between the quantum dot 14 and the fine electrodes 5 and 6 (hereinafter, gap between quantum dot/fine electrodes), and also it is difficult to utilize the gap between quantum dot 14/fine electrodes 5 and 6 as a tunnel barrier.

Furthermore, as shown in FIG. 14B, even though the quantum dot is formed by accident at a center location of the nano gap, many unwanted quantum dots 15 can be present around the nano gap. Therefore, there also arise problems of alteration of the operation point of SET by the charge trapped in the unwanted quantum dots.

Therefore, according to the method disclosed in Nonpatent Document 2 or Nonpatent Document 3, just ones in which the quantum dot was formed only in the nano gap by accident through producing a large number of SET can be merely used in effect. Thus, the method achieves very inferior production yield as a method for production of SET, thereby hampering the practical applicability.

The present invention was made for solving these problems in such conventional methods of the production of SET. Accordingly, an object of the present invention is to provide a method for production of SET in which a quantum dot is selectively arranged in a nano gap between fine electrodes, whereby the product yield is significantly improved, leading to excellent practical applicability.

Means for Solving the Problems

Ferritin is, as shown in FIG. 15, a cage-sharped protein having a diameter of about 12 nm and having a cavity (diameter: about 7 nm) inside thereof formed through binding of 24 subunits. Any of various types of inorganic material particle (core) can be incorporated in this cavity.

The present inventors found that ferritin specifically adsorbs to titanium in the presence of a nonionic surfactant, and investigated in attempts to selectively fix a quantum dot in the nano gap between fine electrodes utilizing this property of ferritin. Accordingly, the present invention was accomplished.

Specifically, in the method for production of SET of the present invention, the semiconductor element includes a substrate, a source electrode, a drain electrode, and a gate electrode, wherein a quantum dot is positioned between the source electrode and the drain electrode, the substrate has an insulating layer on the top face thereof, the substrate has the source electrode and the drain electrode, which are opposed, on the insulating layer, the source electrode and the drain electrode are provided with a titanium film, and a nontitanium metal film consisting of a metal other than titanium that covers the titanium film, respectively, the method for production including:

a ferritin dropping step for dropping a solution containing ferritin including a metal or semiconductor particle therein, thereby allowing the ferritin to be selectively arranged between the source electrode and the drain electrode; and a ferritin decomposing step for decomposing the selectively arranged ferritin, thereby forming the quantum dot consisting of the metal or semiconductor particle between the source electrode and the drain electrode.

By thus forming an insulating film on a semiconductor substrate, laminating thereon a titanium film and a nontitanium metal film consisting of a metal other than titanium so as to cover the titanium film thereby forming fine electrodes (source electrode and drain electrode), and dropping thereto a solution containing ferritin including a metal or semiconductor particle therein, and a nonionic surfactant, the ferritin including the metal or semiconductor particle therein is adsorbed preferentially within a nano gap between the fine electrodes having a particularly high adsorption energy.

Thereafter, upon decomposition of the ferritin, the metal or semiconductor particle can be fixed as a quantum dot at a center location in the nano gap, therefore, SET can be produced in an efficient manner.

The gate electrode may be provided below the insulating layer between the source electrode and the drain electrode.

Further, the gate electrode may be provided laterally to the gap between the source electrode and the drain electrode.

Also, the gate electrode may be provided above the gap between the source electrode and the drain electrode.

In this case, the insulating layer may be a first insulating layer; a second insulating layer may be provided that covers the top face of the substrate having the source electrode, the drain electrode and the quantum dot; and a gate electrode may be provided on the second insulating layer.

It is preferred that the nontitanium metal film covering the titanium film be a gold (Au) film.

The nontitanium metal film preferably has a thickness greater than the thickness of the titanium film.

It is preferred that the solution containing ferritin including a metal or semiconductor particle therein further comprises a 0.01% vol/vol or more and 10% vol/vol or less nonionic surfactant in the ferritin dropping step.

Following the ferritin decomposing step, a protection step may be included for covering the semiconductor substrate surface on which the source electrode and the drain electrode were formed with an insulating layer for protection.

The foregoing objects, other objects, features and advantages of the present invention will be apparent from the detailed description of the following suitable embodiments with reference to the accompanying drawings.

ADVANTAGES OF THE INVENTION

According to the method for production of SET of the present invention, by utilizing the selective adsorptivity of ferritin to the material on the substrate, a quantum dot can be selectively arranged in the nano gap between fine electrodes, whereby product yield in the SET production can be significantly improved.

In addition, the distance between the fine electrode and the quantum dot can be autonomously regulated by means of the film thickness of the ferritin outer shell. Thus, the production process can be simplified, and the gap between the fine electrode and the quantum dot can be utilized as a tunnel barrier.

Moreover, since unwanted quantum dots are not formed around the nano gap between the fine electrodes except for the side wall of the electrodes, variation of the element operation can be suppressed.

Furthermore, the tunnel gap distance is specified to be approximately 0.5 to 2 nm in the prior arts disclosed in Nonpatent Document 2 and Nonpatent Document 3. However, according to the method for production of SET of the present invention, the tunnel gap distance becomes approximately 2 to 4 nm, whereby the device operation at a higher temperature can be also contemplated.

Additionally, multiple dot formation which can not be regulated according to the prior arts disclosed in Nonpatent Document 2 and Nonpatent Document 3 can be also regulated by adjusting the distance between the fine electrodes, whereby enhancement of functionality of the device can be also contemplated.

BRIEF DESCRIPTION OF THE DRAWINGS

FIGS. 1A to 1C show views illustrating one example of the basic structure of SET having a back gate electrode produced in Embodiment 1, in which FIG. 1A shows a perspective view; FIG. 1B shows a top view; and FIG. 1C shows a cross-sectional view.

FIGS. 3A to 3C show views illustrating the state of arrangement of ferritin on the substrate in Embodiment 1 of the present invention, in which FIG. 3A shows a perspective view; FIG. 3B shows a top view; and FIG. 3C shows a cross-sectional view.

FIGS. 4A and 4B show views illustrating the state of fixation of the quantum dot around the fine electrodes, in which FIG. 4A shows the state of fixation according to a conventional method for production; and FIG. 4B shows the state of fixation according to Embodiment 1 of the present invention.

FIGS. 5A and 5B show cross-sectional views illustrating around the fine electrodes, in which FIG. 5A illustrates a case of a titanium monolayer electrode; and FIG. 5B illustrates a case of a bilayer electrode of this Embodiment.

FIGS. 11A and 11B show views illustrating the state of arrangement of ferritin in the nano gap between source/drain in Embodiment 1 of the present invention, in which FIG. 11A shows a view illustrating the case in which a single quantum dot is formed; and FIG. 11B shows a view illustrating the case in which double quantum dots are formed.

FIGS. 12A to 12C show views illustrating one example of the basic structure of SET having a side gate electrode produced in Embodiment 2 of the present invention, in which FIG. 12A shows a perspective view; FIG. 12B shows a top view; and FIG. 12C shows a cross-sectional view.

FIGS. 13A to 13C show views illustrating one example of the basic structure of SET having a top gate electrode produced in Embodiment 3 of the present invention, in which FIG. 13A shows a perspective view; FIG. 13B shows a top view; and FIG. 13C shows a cross-sectional view.

FIGS. 14A and 14B show views illustrating the state of arrangement of a quantum dot(s) of the fine electrodes and therearound according to a conventional method for production of SET, in which FIG. 14A shows a view illustrating the state of arrangement in which the gap between quantum dot/ fine electrodes was not regulated; and FIG. 14B shows a view illustrating the state of arrangement in which unwanted quantum dots are present in and around the nano gap between source/drain.

Figure 1A:
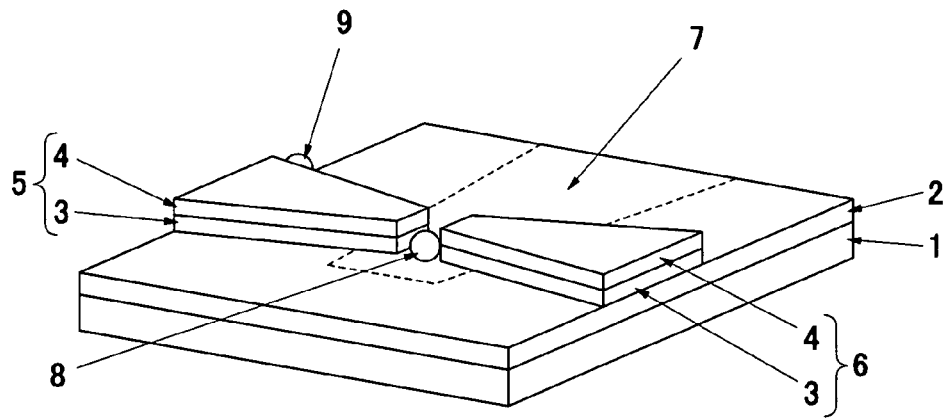

DESCRIPTION OF REFERENCE NUMERALS AND SIGNS 1, 21: silicon substrate
2: insulating layer
3: titanium thin film
4: nontitanium metal thin film (metal thin film consisting of a metal other than titanium)
5, 28: source electrode
6, 29: drain electrode
7, 23: back gate electrode
8: quantum dot (metal or semiconductor particle)
9: lateral face quantum dot
10: outer shell protein of ferritin
11: ferritin including a metal or semiconductor particle therein
12: ferritin including a metal or semiconductor particle therein, and adsorbed on fine electrode lateral face
13: selective adsorption region
14: quantum dot
15: unwanted quantum dot 22: silicon oxide film ($SiO_2$ film)
24: pad electrode
25: electron beam resist
26: electron beam irradiated region
27: vapor deposited Ti thin film and Au thin film
30: indium-including ferritin
31: indium quantum dot
32: wiring with FIB (focused ion beam) apparatus
33: wire
41: side gate electrode
42: first insulating layer
43: second insulating layer
44: top gate electrode

PREFERRED MODE FOR CARRYING OUT THE INVENTION

Hereinafter, embodiments of the present invention will be explained with reference to the drawing. The present invention is not any how limited to the following Embodiments.

Embodiment 1

Embodiment 1 illustrates a method for production of SET (single electron transistor) having a back gate electrode. The basic structure of SET produced by this Embodiment is shown in FIGS. 1A to 1C.

In this SET, an insulating layer 2 ($SiO_2$ film) is formed on a silicon substrate 1, and thereon are formed a source electrode 5 and a drain electrode 6 including a laminated titanium thin film 3 and a nontitanium metal thin film consisting of a metal other than titanium (hereinafter, referred to as "nontitanium metal thin film") 4 that covers the titanium thin film 3. The source electrode 5 and the drain electrode 6 are formed so as to oppose one another thereby providing a nano gap therebetween in a plan view. Furthermore, a back gate electrode 7 is formed immediately below the insulating layer 2. The back gate electrode 7 is formed so as to locate below the nano gap and therearound.

At the center location of the nano gap between the source electrode 5 and the drain electrode 6 a metal or semiconductor particle is selectively arranged and fixed as a quantum dot 8, and a few unwanted quantum dots can be present around the nano gap.

Figure 1B:
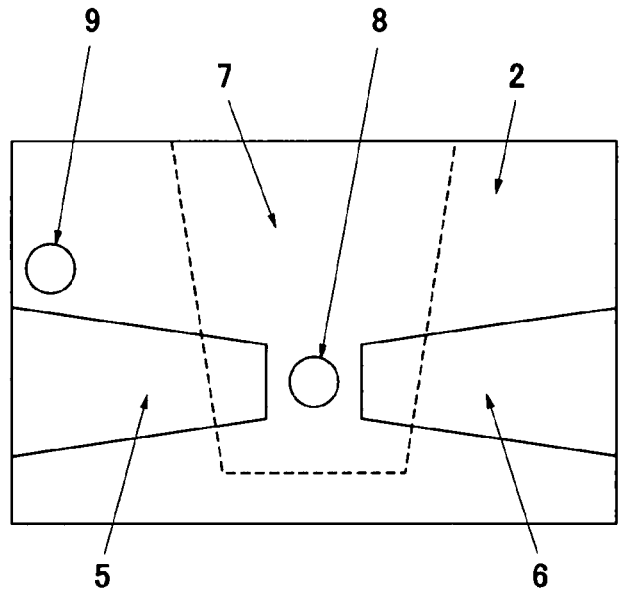
Figure 1C:
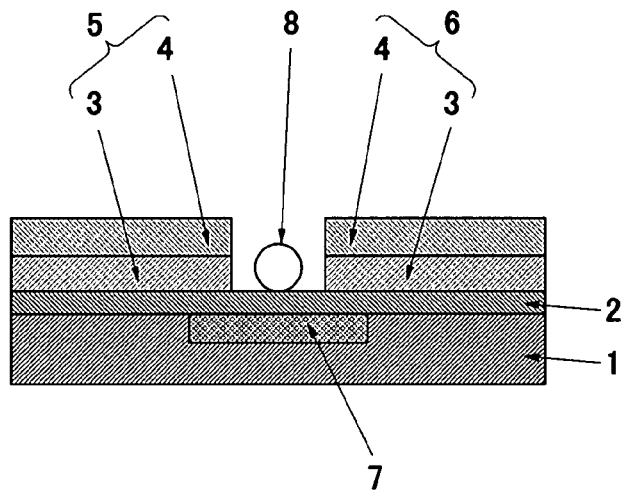

Although a metal or semiconductor particle (lateral face quantum dot 9) is also present in the vicinity of the lateral face of the source electrode 5 or the drain electrode 6 in SET shown in FIGS. 1A to 1C, it has less influence on the SET operation.

Next, a method for production of SET of this Embodiment will be explained.

Figure 2:
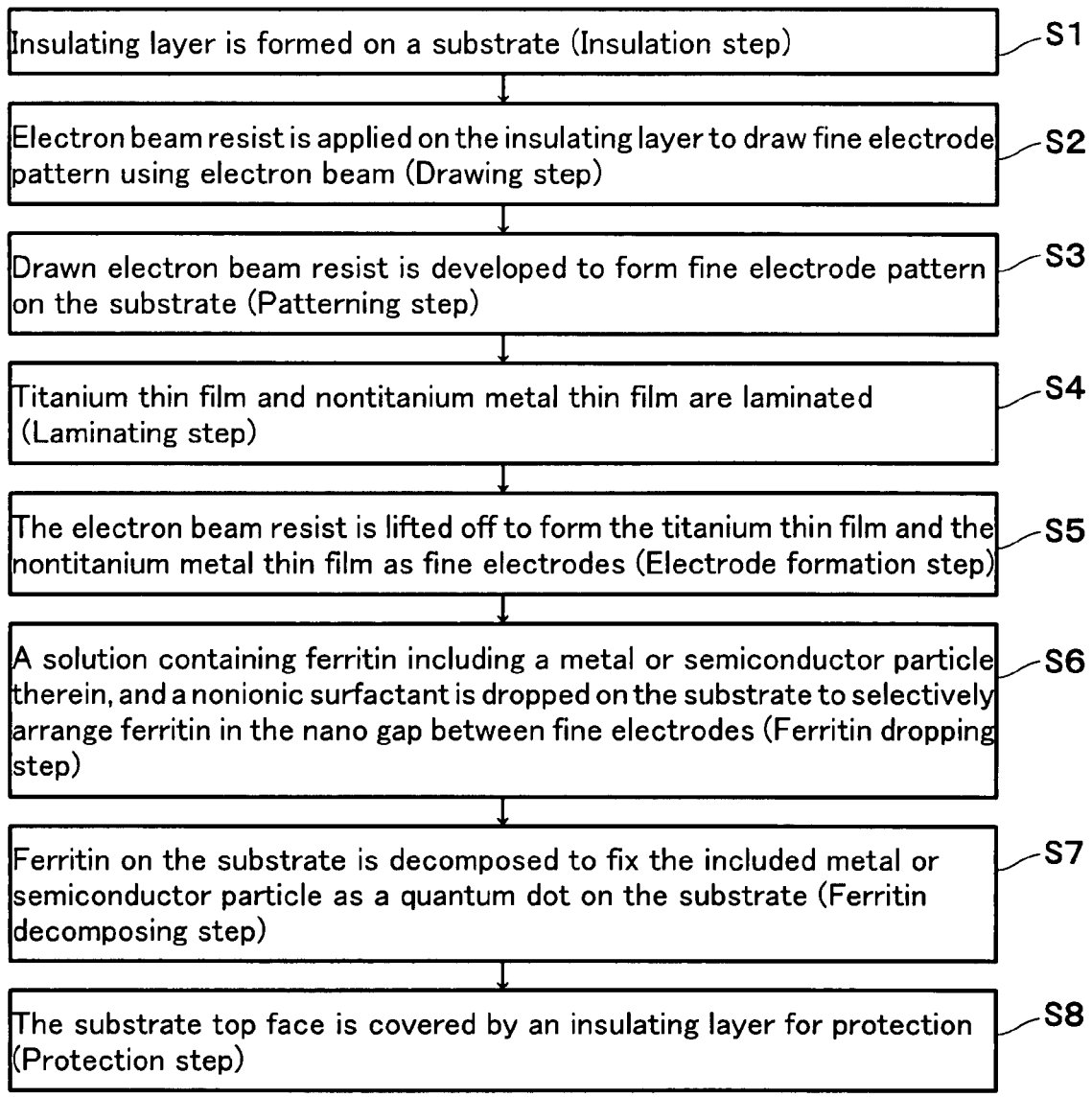
FIG. 2 shows a flow chart for demonstrating the method for production of SET according to Embodiment 1 of the present invention.

A flow chart of the production steps of this Embodiment is shown in FIG. 2. Referring to FIGS. 1A to 1C and FIG. 2, in step S1, the insulating layer 2 is first formed on the silicon substrate 1 on which the back gate electrode 7 had been formed (insulation step). For the formation of the insulating layer 2 on the silicon substrate 1, any known method may be employed, and also type of the insulating layer 2 is not particularly limited.

Next, in the step S2, an electron beam resist is applied on the insulating layer 2 formed on the substrate 1, thereby drawing a pair of fine electrode patterns with use of an electron beam (drawing step). The pair of fine electrode patterns correspond to the source electrode 5 and the drain electrode 6. The pair of fine electrode patterns are drawn such that the gap therebetween (hereinafter, gap between the fine electrodes) is positioned above the back gate electrode 7.

In this step, since one quantum dot is arranged in the gap between the fine electrodes, the drawing is regulated such that the gap between the fine electrodes satisfies within the formula of: minimum electrode interval≦ferritin diameter. Such a method of drawing the fine electrode pattern is well known in the field of semiconductors, therefore, the description of the same is omitted herein.

Next, in the step S3, the electron beam resist is developed, whereby the fine electrode pattern is formed on the substrate 1 (patterning step). By the development, the electron beam-irradiated region is decomposed of from the electron beam resist applied on the insulating layer 2, and thus the fine electrode pattern is formed which consists of the exposed region of the insulating layer 2 on the substrate 1.

Next, in the step S4, the titanium thin film 3, and the nontitanium metal thin film 4 that covers the titanium thin film 3 are vapor deposited on the substrate 1 on which the fine electrode pattern was formed in the step S3, whereby two or more layers (herein, two layers) are sequentially laminated (laminating step). The titanium thin film 3 corresponding to the underlayer has a thickness of preferably 1 nm or greater and 12 nm or less. When the thickness is less than 1 nm, contact of the outer shell protein of ferritin with the titanium thin film 3 may be insufficient. In contrast, when the thickness is beyond 12 nm, adsorption of plural number of the particles of ferritin in the elevational direction can not be suppressed.

In addition, the thickness of the titanium thin film 3 being less than 6 nm is more preferred since ferritin adsorbed to the titanium thin film 3 also adsorbs to the insulating layer 2 without fail. Failure of adsorption of ferritin to the insulating layer 2 can lead to contact of the core with the source electrode or the drain electrode upon decomposition of the outer shell protein.

Meanwhile, a region opposing to the quantum dot of the titanium thin film 3 is oxidized by exposure to the ambient air and the like, thereby resulting in formation of $TiO_2$. Thus, transfer of the charge between the dot and the source/drain electrodes is more readily executed on the nontitanium metal thin film 4 as compared with that on the titanium thin film 3. The thickness of the titanium thin film 3 of equal to or less than 3 nm is more preferred because positional shift between the nontitanium metal thin film 4 and the quantum dot in the elevational direction can be prevented, whereby charge transfer between the nontitanium metal thin film 4 and the quantum dot is facilitated.

Mode of covering of the titanium thin film 3 by the nontitanium metal thin film 4 will be explained in detail below. As shown in FIG. 1A, the nontitanium metal thin film 4 covers the top face of the titanium thin film 3, however, the lateral face of the titanium thin film 3 is not fundamentally covered. However, the lateral face of the titanium thin film 3 may be covered by the nontitanium metal thin film 4 except for a part sandwiched between the source electrode 5 and the drain electrode 6 (the part in which the quantum dot 8 is present in FIGS. 1A to 1C). In other words, the part where the lateral face quantum dot 9 is present on the lateral face of the titanium thin film 3 in FIGS. 1A to 1C may be covered by the nontitanium metal thin film 4.

The part sandwiched between the source electrode 5 and the drain electrode 6 (the part in which the quantum dot 8 is present in FIGS. 1A to 1C) must not be covered by the nontitanium metal thin film 4. When this part is covered, the quantum dot 8 sandwiched between the source electrode 5 and the drain electrode 6 is not formed.

Examples of the metal other than titanium which may be preferably used include noble metals such as gold (Au), platinum (Pt), silver (Ag), palladium (Pd) and the like. The nontitanium metal thin film 4 of the second or latter layer(s) has a thickness of preferably 2 nm or greater and 100 nm or less. When the thickness is less than 2 nm, resistance of the nontitanium metal thin film 4 may be great, and in contrast, when the thickness is beyond 100 nm, production of the nano gap electrode by lifting off or the like may be difficult. Also, as long as the outermost layer of the fine electrode is the nontitanium metal thin film, the nontitanium metal thin film may either have one layer, or have two or more layers or the same of different metal(s).

Next, in the step S5, the substrate following the laminating step is dipped in an organic solvent, and the electron beam resist below the titanium thin film is lifted off, whereby the titanium thin film and the nontitanium metal thin film are formed as a fine electrode (electrode formation step). When the electron beam resist is lifted off, the source electrode 5 and the drain electrode 6 each having the under layer being the titanium thin film 3 and the upper layer being the nontitanium metal thin film 4 are formed on the insulating layer 2. Accordingly, the nano gap between source/drain would have the interval adjusted in the drawing step.

Next, in the step S6, a solution containing ferritin including a metal or semiconductor particle therein, and a nonionic surfactant is prepared, and this solution is dropped on the substrate 1 following the electrode formation step. Thus, the ferritin including the metal or semiconductor particle therein is selectively arranged in the nano gap between source/drain (not shown in the Figure: ferritin dropping step).

The nonionic surfactant is not particularly limited, but Tween 20 and Tween 80 were used in Examples described later. Also, the concentration of the nonionic surfactant is preferably 0.01% vol/vol or greater and 10% vol/vol or less.

The metal or semiconductor particle included in ferritin as the core is not particularly limited. The process for preparing ferritin including the metal or semiconductor particle therein will be described later by way of Examples.

After dropping the solution containing ferritin including the metal or semiconductor particle therein, and a nonionic surfactant on the substrate 1 following the electrode formation step, the substrate 1 is washed using a wash fluid. This washing results in elimination of ferritin other than the ferritin including the metal or semiconductor particle therein which was either selectively adsorbed and arranged in the nano gap between source/drain, or adsorbed on titanium of the lateral face of the source electrode 5 and drain electrode 6, from the substrate 1.

Next, in the step S7, the outer shell protein of the ferritin including the metal or semiconductor particle therein on the substrate 1 is decomposed (ferritin decomposing step). The process for the decomposition may be by, for example, means such as heating, ultraviolet irradiation, ozone oxidation and the like, which may be alone or employed in combination. Upon decomposition of the ferritin, the metal or semiconductor particle (core) which had been included therein is fixed on the insulating layer 2 as the quantum dot 8 at the place unchanged where the ferritin including the metal or semiconductor particle therein had been arranged.

Still more, following the step S7, similarly to common semiconductor devices, the substrate 1 top face is covered with the insulating layer for protection (protection step). For covering the substrate 1 top face, known method may be utilized.

Next, the method for production of SET of this Embodiment will be explained.

Figure 3A:
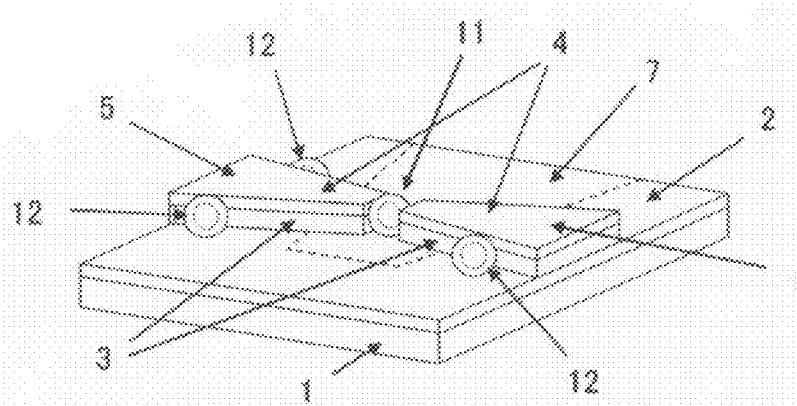
Figure 3B:
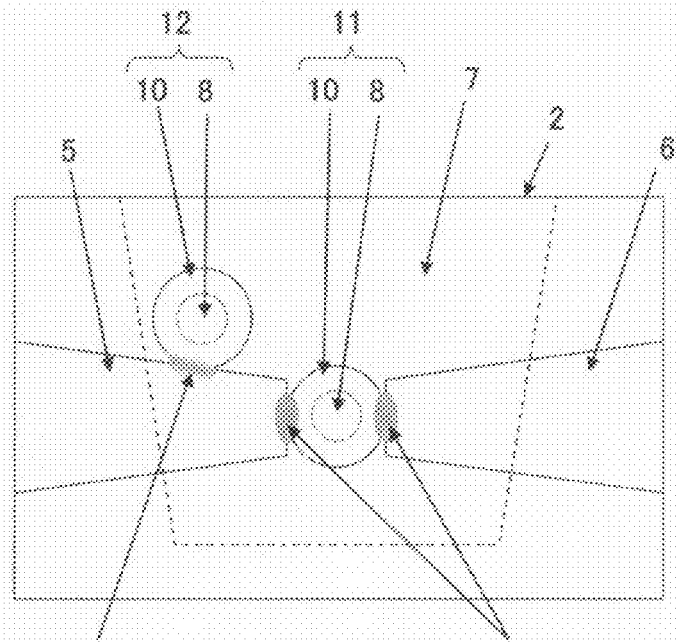
Figure 3C:
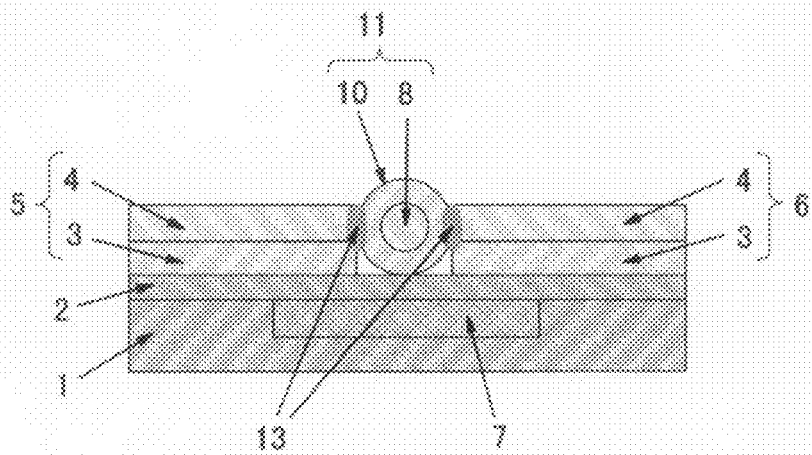

According to this Embodiment, in the step S5, the fine electrodes (source electrode 5 and drain electrode 6) are formed on the silicon substrate 1 on which the insulating layer 2 (for example, SiO₂ film) has been formed on its top face by sequentially laminating the titanium thin film 3 and the nontitanium metal thin film 4, as shown in FIGS. 3A to 3C.

In this step, the nano gap between the source electrode 5 and the drain electrode 6 (hereinafter, nano gap between source/drain) is adjusted so as to satisfy the formula of minimum electrode interval≦ferritin diameter. Although the insulating layer 2 is provided on the top face of the substrate 1 in this Embodiment, the entire substrate may be the insulator such as the case of, for example, an organic film because the substrate shall have the insulating layer on the top face also in such a case. However, the substrate is typically composed of a semiconductor, and the insulating layer is formed on the top face thereof by oxidation.

When a solution containing ferritin 11 including a metal or semiconductor particle 8 therein, and a nonionic surfactant is dropped on such a substrate 1 in the step S6, the ferritin 11 including the metal or semiconductor particle 8 (core) therein is selectively adsorbed on titanium of the lateral face of the source electrode 5 and drain electrode 6.

In contrast, it is not adsorbed on the part other than titanium on the substrate 1, i.e., top face of the fine electrode (nontitanium metal thin film 4) and on the insulating layer 2 (see, FIGS. 3A and 3B).

Particularly, in the nano gap between source/drain, the ferritin 11 including the metal or semiconductor particle 8 therein is adsorbed on the titanium part of the lateral faces of both the source electrode 5 and the drain electrode 6, therefore, adsorption energy is two times greater as compared with the ferritin (ferritin including a metal or semiconductor particle therein, and adsorbed on fine electrode lateral face) 12 shown in FIGS. 3A and 3B (area of the selective adsorption region 13 being two-fold). Accordingly, the ferritin 11 including the metal or semiconductor particle 8 therein is preferentially adsorbed and arranged in the nano gap between source/drain.

When the substrate is washed, the ferritin 11 including the metal or semiconductor particle 8 therein that is present on the nontitanium metal thin film 4 or the insulating layer 2 is eliminated from the substrate together with the wash fluid. Then, only the ferritin including the metal or semiconductor particle 8 therein (ferritin 11 and ferritin 12 shown in FIGS. 3A and 3B) adsorbed on titanium on the lateral faces of the source electrode 5 and the drain electrode 6 is left on the substrate. Particularly, the ferritin 11 is less likely to be eliminated in washing because of greater adsorption energy than that of the ferritin 12.

Next, when the outer shell protein 10 of the ferritin 11 is decomposed by heating or the like of the substrate following the adsorption of ferritin in the step S7, the metal or semiconductor particle 8 which had been included is fixed at the center location of the nano gap between source/drain as the quantum dot 8. Thus, the gap between the quantum dot and the fine electrode (hereinafter, gap between quantum dot/fine electrodes) can be utilized as a tunnel barrier.

Although unnecessary quantum dot is not present in and around the nano gap between source/drain except for the side wall of the electrode, the quantum dot is fixed also at the position where the ferritin 12 had been adsorbed and arranges as shown in FIGS. 3A and 3B (lateral face of the source electrode 5 or the drain electrode 6). However, because many of these quantum dots (for example, quantum dot 9 shown in FIG. 1B) are positioned away from the gap between the source/drain, the charge is less likely to be trapped, and even though it happens to be trapped, less influence will be imparted on the operation point of SET.

Hereinafter, this action and effect will be explained in more detail.

<Autonomous Control of Gap between Quantum Dot/Fine Electrodes>

In general, the nano gap between source/drain varies every individual fine electrodes. Also in one fine electrode, as shown in FIGS. 4A and 4B, there exist differences (variation) in size of the gap depending on the position.

Figure 4A:
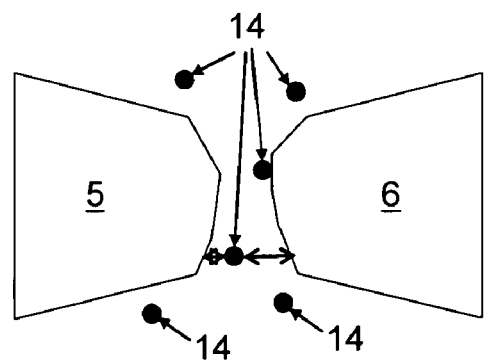

As described above, in conventional methods for production of SET disclosed in Nonpatent Document 2 and Nonpatent Document 3, even though the quantum dot 14 is fixed in the nano gap between source/drain as shown in FIG. 4A, control of the gap between quantum dot/fine electrodes is impossible, and thus the quantum dot could not be intentionally fixed at the center location of the nano gap between source/drain.

To the contrary, in the ferritin arrangement step of this Embodiment, ferritin is preferentially adsorbed and arranged at the center location of the nano gap between source/drain in the presence of the nonionic surfactant, however, a position where the potential energy is minimized (position where adsorbed without aberration from lateral faces of both the source electrode and the drain electrode) is selected and transferred on each fine electrode.

Figure 4B:
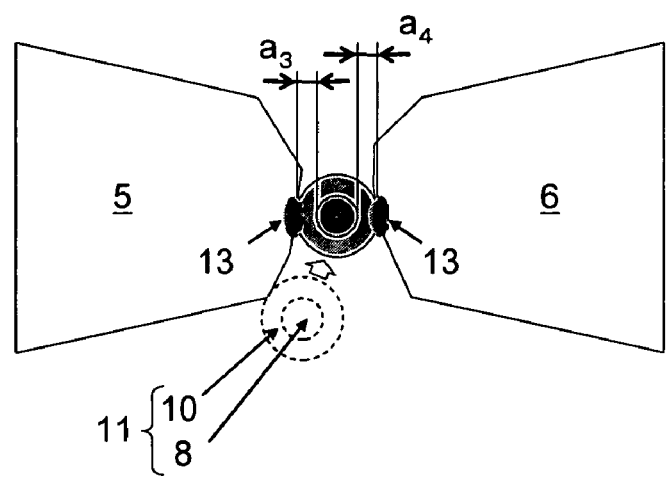

As a consequence, when the variation of the nano gap between source/drain falls within a suitable range, the metal or semiconductor particle 8 (core) included in ferritin is autonomously fixed at center of the nano gap between source/drain in the state of keeping the quantum dot/fine electrode gap determined depending on the thickness (film thickness) of the ferritin that forms the outer shell, as shown in FIG. 4B.

Accordingly, the quantum dot can be selectively fixed at the most suitable position in the nano gap between source/drain in this Embodiment, therefore, the SET product yield can be significantly improved as compared with the conventional methods for production of SET which are dependent on accidental event.

<Suppression of Crosslinking Adsorption>

Figure 5A:
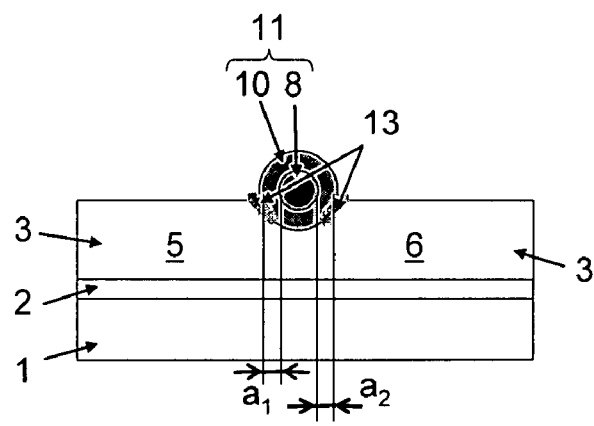

It would be sufficient to constitute the source electrode and the drain electrode with titanium alone when adsorption and arrangement of ferritin in the nano gap between source/drain shall be merely effected. However, in this case, "crosslinking adsorption" of the nano gap between source/drain as shown in FIG. 5A may be caused at a part that is smaller than the external diameter of ferritin 11 including a metal or semiconductor particle 8 (core) therein.

When the outer shell protein 10 is decomposed in this state, the position where the metal or semiconductor particle 8 (core) which had been included therein is fixed may be altered due to the adsorption angle attained between the source electrode 5 and drain electrode 6, and the ferritin 11 in the state of crosslinking adsorption. In the example shown in FIG. 5A, the gap between quantum dot/fine electrodes (a1 and a2) has been smaller than the film thickness of the outer shell protein 10.

Also, after the decomposition of the outer shell protein 10, the quantum dot 8 may be contacted with the surface of the source electrode 5 or drain electrode 6 in some cases. Under such circumstances, it would be impossible to utilize the gap between quantum dot/fine electrodes as a tunnel barrier.

Figure 5B:
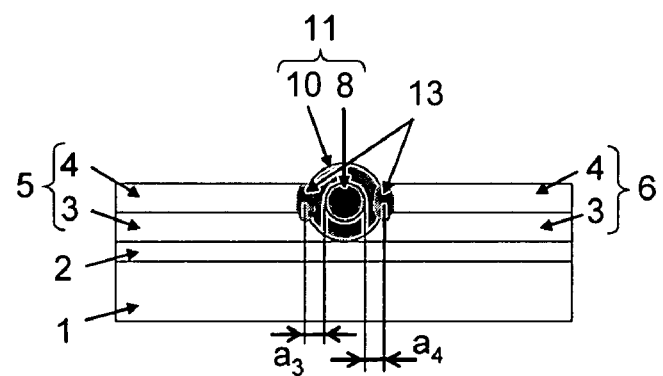

Thus, in this Embodiment, the source electrode 5 and the drain electrode 6 are formed through covering the titanium thin film 3 with the nontitanium metal thin film 4 (laminating the nontitanium metal thin film 4 on the titanium thin film 3) so as to provide the outermost layer that is a nontitanium metal as shown in FIG. 5B. By thus constructing to have such a structure, "crosslinking adsorption" of the ferritin 11 including the metal or semiconductor particle 8 (core) therein between the source electrode 5 and the drain electrode 6 can be prevented in the ferritin arrangement step (step S6). As a consequence, after the decomposition of the outer shell protein 10, the gap between the quantum dot/fine electrodes (a3) and (a4) becomes almost equal to the film thickness of the outer shell protein 10.

In Prior Arts, the tunnel gap distance has been set to be approximately 0.5 to 2 nm, and the film thickness of the outer shell protein 10 has been about 2.5 nm. The gap between quantum dot/fine electrodes may be also dependent on the core size and shape, it can be adjusted to approximately 2 to 4 nm. Therefore, attempts of elevation of the temperature of the device operation can be made in this Embodiment.

EXAMPLE 1

Next, in Example 1, a source electrode and a drain electrode constituted with a titanium thin film and a gold (Au) thin film were formed on the silicon substrate, and SET in which an indium quantum dot was selectively fixed in the nano gap between source/drain was produced. Hereinafter, with reference to FIGS. 6A to 6I, Example 1 will be explained.

(Insulation Step)

First, a back gate electrode 23 was produced on a silicon substrate 21. Then, a $SiO_2$ film 22 was formed as the insulating layer on the top face of the silicon substrate 21. In addition, on the $SiO_2$ film 22 was formed a pad electrode 24 for the wiring to be perfected later. Moreover, after washing the top face of the silicon substrate 1 with pure water, it was cleaned by UV (ultraviolet) irradiation in the presence of ozone ($O_3$) at 110° C. for 10 min using an UV/ozonation apparatus (see, FIG. 6A).

(Drawing Step)

Next, the silicon substrate 21 was placed in a spin coater, and thereto was added dropwise a solution prepared by adding anisole to an electron beam resist (Zeon Corporation, ZEP520A) thereby diluting to give a concentration of 25%. Then, after spinning the silicon substrate 1 at 2000 rpm for 5 sec, it was further spun at 4000 rpm for 60 sec. Thereafter, the substrate 1 was prebaked on a hot plate at 140° C., for 3 min, where fixation of an electron beam resist 25 was permitted (see, FIG. 6B).

Figure 6A:
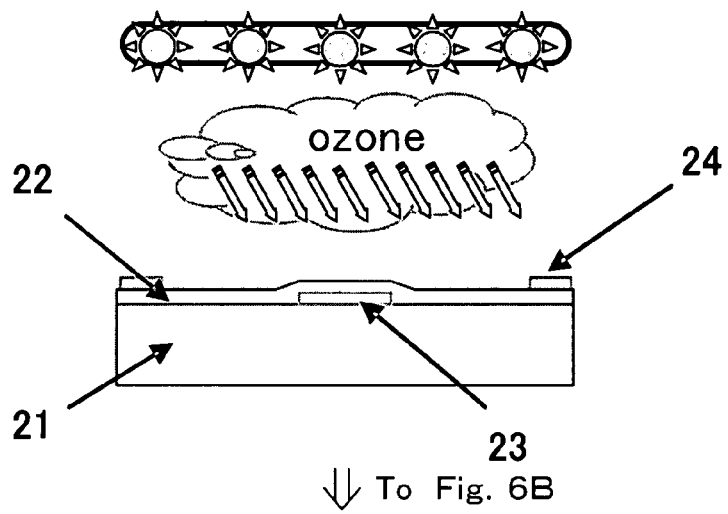
FIGS. 6A to 6I show cross-sectional views illustrating the steps of the method for production of SET of Example 1, respectively.
Figure 6B:
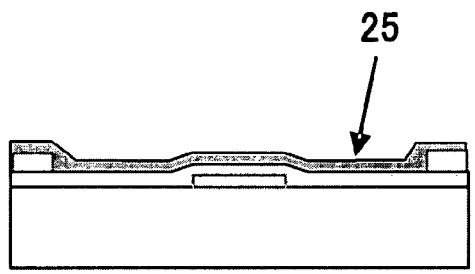
Figure 6C:
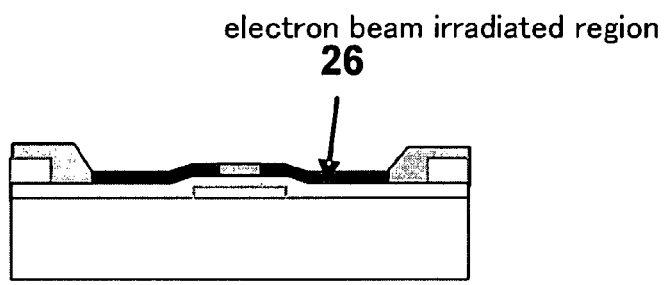
Figure 6D:
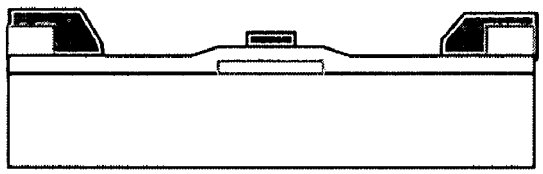
Figure 6E:
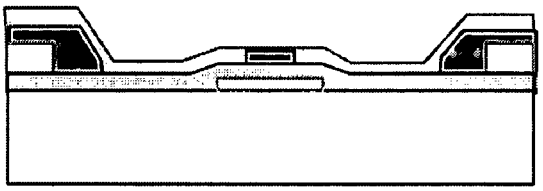
Figure 6F:
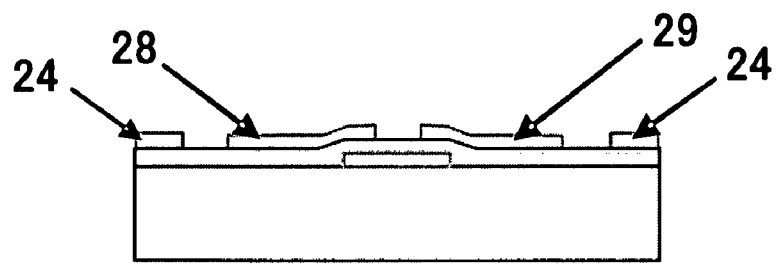
Figure 6G:
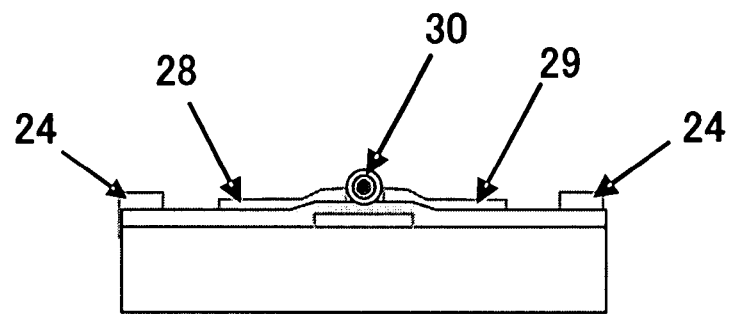

After cooling to room temperature, a fine electrode pattern was drawn using an electron beam bean exposing apparatus so as to give the nano gap between source/drain of 20 nm (see, FIG. 6C).

(Patterning Step)

Subsequently, the silicon substrate 21 on which the fine electrode pattern was drawn was immersed in n-amyl acetate for 1 min. Thereafter, excess n-amyl acetate was removed with nitrogen gas blow to produce a fine resist pattern on the silicon substrate 21 (see, FIG. 6D).

(Laminating Step)

Next, the silicon substrate 21 on which the fine resist pattern was produced was placed in a vapor deposition apparatus, and vacuum pumping was carried out. Then, vapor deposition of a titanium (Ti) thin film was first conducted to give a thickness of 2 nm. Thereafter, vapor deposition of a gold (Au) thin film was carried out to give a thickness of 10 nm, whereby a gold thin film was laminated (reference sign 27) such that the titanium thin film is covered (see, FIG. 6E).

(Electrode Formation Step)

Next, the silicon substrate 21 on which the titanium thin film and the gold thin film were laminated was immersed for 10 min in dimethyl acetamide which had been kept at 40° C. Thereafter, the substrate in a vessel involving dimethyl acetamide was placed as a whole in an ultrasonic cleaning apparatus, and subjected to ultrasonic cleaning for 5 min. Following the ultrasonic cleaning, the silicon substrate 21 was removed, and the surface was rinsed with acetone.

Furthermore, after rinsing the substrate surface with pure water, the silicon substrate 21 was placed in a spin coater, and spun at 2000 rpm for 5 sec, and thereafter spun at 4000 rpm for 30 sec to eliminate excess moisture. By the steps thus far, the titanium thin film and the gold thin film were laminated to form a source electrode 28 and a drain electrode 29 (nano gap between source/drain=20 nm) (see, FIG. 6F).

(Ferritin Dropping Step)

Next, a solution containing ferritin including an indium particle therein (indium-including ferritin 30), and a nonionic surfactant was prepared. Preparation of the ferritin 30 including the indium particle therein will be explained in detail below.

Although naturally occurring ferritin (derived from equine spleen) is composed of 24 subunits assembled together, the naturally occurring ferritin does not have a constant structure since there are two types of the subunit having slightly distinct structures, i.e., L type and H type. Therefore, recombinant ferritin composed of the L type subunit alone was used in this Example.

First, a DNA encoding L type ferritin (SEQ ID NO: 1, 507 base pairs) was amplified using a PCR technique to provide a large amount of L type ferritin DNA.

Subsequently, this L type ferritin DNA was cleaved at sites which are specifically cleaved by restriction enzymes EcoRI and Hind III (restriction enzyme sites). By this treatment of cleavage, a solution containing the L type ferritin DNA fragment having the EcoRI and Hind III restriction enzyme sites was prepared. DNA electrophoresis of this solution was carried out, whereby only the DNA fragment encoding the L type ferritin was recovered and purified.

Thereafter, this L type ferritin DNA fragment was incubated with a vector plasmid (pMK-2) which had been treated with the EcoRI-Hind III restriction enzymes to effect ligation. Thus, a vector plasmid pMK-2-fer-8 in which the L type ferritin DNA was incorporated in the pMK-2 plasmid at a multicloning site (MCS) was produced. The employed vector plasmid pMK-2 was selected because it is advantageous in obtaining a large amount of ferritin, which is characterized by being a multicopy plasmid having Tac promoter as a promoter, thereby yielding many number of copies. Thus produced plasmid (pMK-2-fer-8) was introduced (transformed) into *E. coli* Nova Blue (*Novagen, Escherichia coli* strain) that is a host to produce a recombinant L type ferritin strain (fer-8).

The fer-8 strain was recovered by centrifugal separation at a low speed, and suspended in a 50 mM Tris-HCl buffer (pH 8.0, +150 mM NaCl). After subjecting this solution to ultrasonic vibration at 60° C. for 20 min, the host cells were recovered again by centrifugal separation at a low speed. Recombinant ferritin (apoferritin) in the suspension was purified by an ion exchange column (Q-sepharose, Amarsham Biosciences) and gel filtration (Hiprep Sephacryl S-300: Amarsham Biosciences; and G4000SWXL PEEK: Tosoh Corporation).

Eluate from the ion exchange column was fractionated, and identified on SDS-PAGE. A fraction containing the recombinant ferritin (apoferritin, SEQ ID NO: 2) alone was recovered, and subjected to gel filtration. Accordingly, a recombinant ferritin monomer was recovered.

Next, a solution of 200 mM monosodium phosphate, 40 mM hydrochloric acid and 4 mM ammonia was prepared, and the pH was adjusted to about 2.8. Using this solution, a recombinant ferritin (fer-8) solution was prepared to give the concentration of 0.1 mg/mL, and thereto was further added 20 mM indium sulfate so as to give the final concentration of 1 mM. The reaction solution was stirred, and thereafter left to stand overnight.

Subsequently, the recombinant ferritin including the indium compound core formed therein was purified and recovered the molecules from the solution following the reaction by centrifugal separation and gel filtration. The centrifugal separation was carried out under a condition of 4,000 G for 30 min, and unnecessary portion other than ferritin was eliminated stepwise in the form of precipitates. The recombinant ferritin including the indium core formed therein was concentrated from the finally left supernatant by centrifugal concentration using a centrifuge filter (450 nm, Centriprep 50, manufactured by Amicon).

Free indium and aggregation of ferritin molecules were eliminated from thus resulting recombinant ferritin (indium-including ferritin) using column chromatography (Sephadex G-25 and Cephacryl S-300 column).

Finally, the recombinant ferritin was concentrated by centrifugal concentration using a centrifuge filter (450 nm, Centriprep 50, manufactured by Amicon) to give the concentration of 3.0 mg/mL.

To thus resulting ferritin including the indium compound therein (indium-including ferritin 30) was added a MES/Tris buffer (100 mM, pH 7.0) containing 1% vol/vol of Tween 20 added as a nonionic surfactant to adjust the ferritin concentration of 2 mg/mL. The ferritin solution after adjusting the concentration was dropped on the substrate on which the fine electrodes were formed, and kept for 30 min, whereby the indium-including ferritin 30 was selectively adsorbed and arranged in the nano gap between source/drain.

Thirty minutes later, the silicon substrate 21 was rinsed using pure water, and washed with running pure water for 5 min. After washing, the substrate 1 was placed in a spin coater, which was spun at 2000 rpm for 5 sec, and thereafter spun at 4000 rpm for 30 sec to eliminate excess moisture (see, FIG. 6G).

(Ferritin Decomposing Step)

Figure 6H:
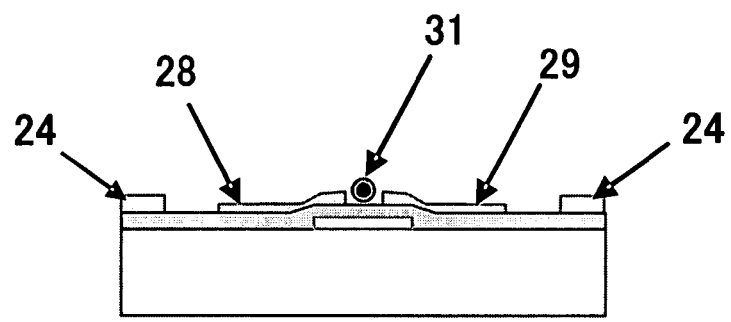

Next, using an UV/ozonation apparatus, the outer shell protein of ferritin on the silicon substrate 21 was decomposed by irradiating UV (ultraviolet) in the presence of ozone ($O_3$) at 110° C. for 40 min to fix the indium compound included in ferritin as the quantum dot 31 (see, FIG. 6H).

Figure 7:
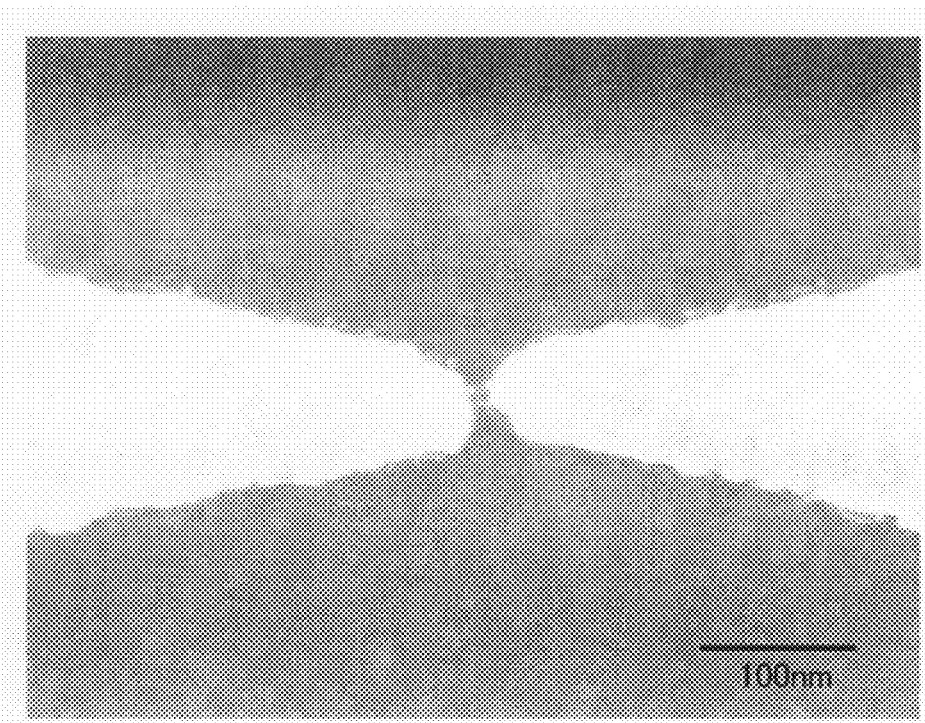
FIG. 7 shows an electron micrograph for illustrating around the source electrode and the drain electrode of the SET substrate obtained in Example 1.

An electron micrograph of the source electrode 28 and the drain electrode 29, and the vicinity thereof on the silicon substrate 21 following the ferritin decomposing step is shown in FIG. 7.

In FIG. 7, the indium quantum dot has been fixed on the lateral face of the source electrode 28 on the left handside of the image, and of the drain electrode 29 on the right handside of the image, but no indium quantum dot was present except for the side wall of the electrode in and around the nano gap between source/drain (about 20 nm).

Figure 6I:
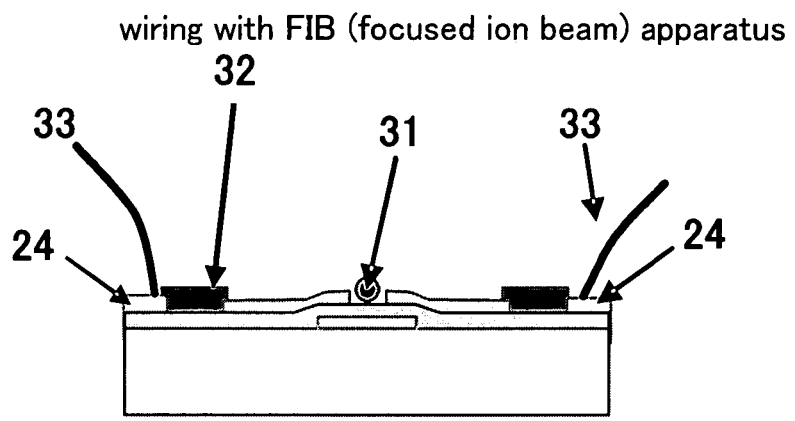

Next, as shown in FIG. 6I, wirings 32 were provided on the pad electrode 24, the source electrode 28 and the drain electrode 29 on the substrate following the ferritin decomposing step for output of the signal utilizing an FIB (focused ion beam) apparatus (see, FIG. 6I). The silicon substrate 21 after the wiring was placed in a low temperature prober (PPMS, manufactured by Quantum Design Japan Inc.), and the temperature was set to be 4.2 K (Kelvin). Thereafter, for determination of the electric characteristics, the output terminal was connected to an apparatus for determining semiconductor parameters (4156C, manufactured by Agilent Technologies Japan, Ltd.).

First, setting of the gate electrode was made at 0 V, and the voltage between the source electrode and the drain electrode was changed in the range of from −0.6 V to +0.6 V, whereby alteration of the drain electric current was measured. The measurement results are shown in FIG. 8.

Figure 8:
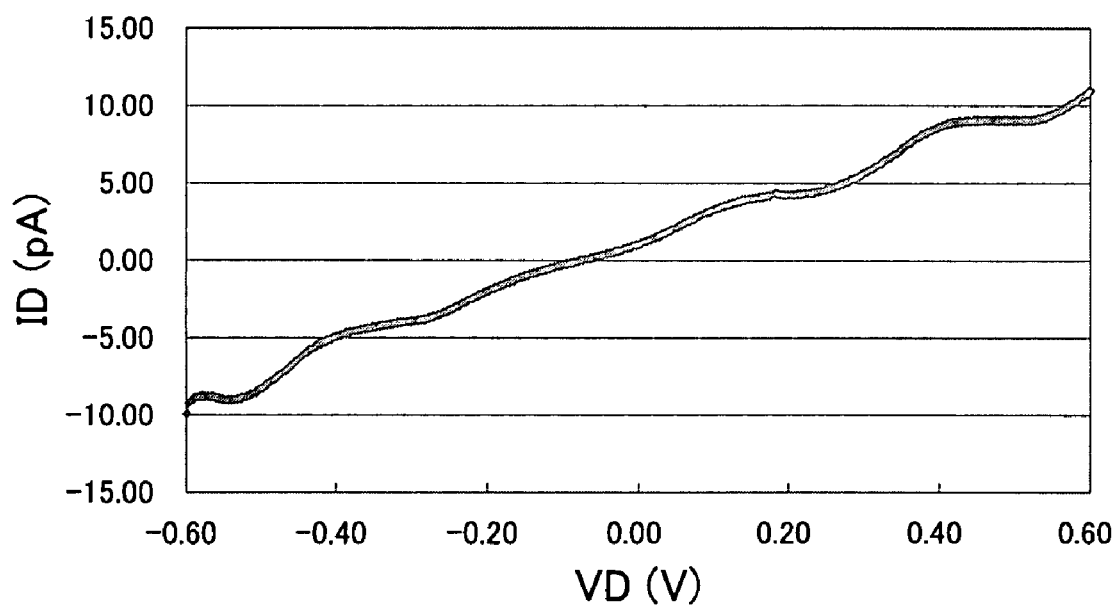
FIG. 8 shows a graph demonstrating the alteration of drain electric current when the voltage between the source electrode and the drain electrode was changed on the SET substrate obtained in Example 1.

As is clear from FIG. 8, stepwise electric current-voltage characteristics were achieved, and probability of the substrate of Example 1 bearing a coulomb blockade effect was found. In other words, it was ascertained that the substrate of Example 1 functioned as SET. Moreover, it was also verified that the source electrode and the drain electrode were insulated in the element without any dot produced in a similar manner.

Although Tween 20 was used as a nonionic surfactant in Example 1, similar electric current-voltage characteristics were verified also on the SET substrate produced with use of Tween 80 at the same concentration.

Modification Example of this Embodiment

In this Embodiment and Example 1, the gap between the fine electrodes was adjusted so as to satisfy the formula of: minimum electrode interval≦ferritin diameter for arranging one quantum dot in the gap between the fine electrodes. When arrangement of two quantum dots in the gap between the fine electrodes is intended, the gap may be adjusted so as to satisfy the formula of: ferritin diameter≦minimum electrode interval<ferritin diameter×2.

Figure 11A:
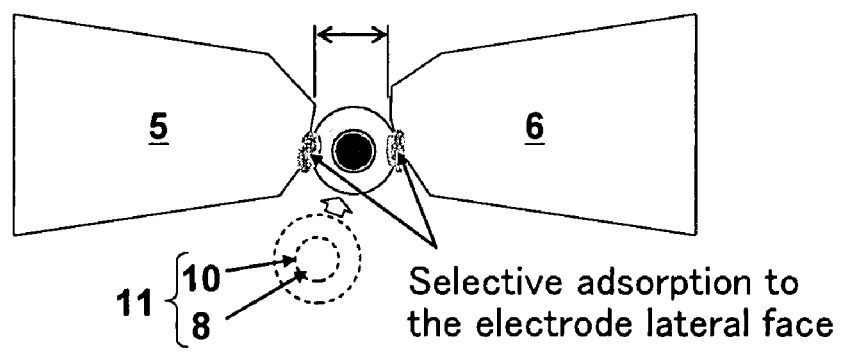

More specifically, when the minimum interval between the source electrode and the drain electrode is smaller than the diameter of ferritin of about 12 nm (i.e., in the case of satisfying the formula of: minimum electrode interval≦ferritin diameter), the ferritin 11 including the metal or semiconductor particle 8 (core) therein is selectively adsorbed at a position where the potential energy is minimum between the source electrode 5 and the drain electrode 6 as shown in FIG. 11A. In this case, after the decomposition of the outer shell protein 10, one quantum dot (single dot) would be formed at the center location of the nano gap between source electrode 5/drain electrode 6.

Figure 11B:
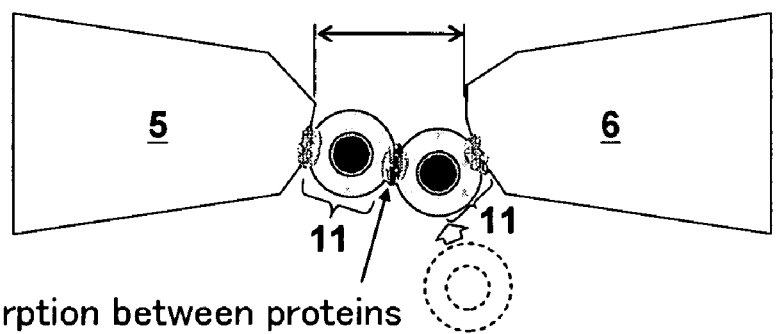

On the other hand, when the minimum interval between the source electrode 5 and the drain electrode 6 is greater than the diameter of ferritin and smaller than twice the diameter of ferritin (i.e., in the case of satisfying the formula of: ferritin diameter<minimum electrode interval≦ferritin diameter×2), each one ferritin 11 including the metal or semiconductor particle 8 (core) therein is adsorbed on titanium of the lateral face of the source electrode 5 and the drain electrode 6, respectively, and the ferritin 11 would adsorb one another by the adsorption between proteins, as shown in FIG. 11B.

These two particles of the ferritin 11 are rigidly fixed by the binding force of the lateral face of the source electrode 5 or the drain electrode 6 with titanium, and interprotein binding force of the ferritin 11 one another, therefore, even though the substrate is washed, they remain at the position shown in FIG. 11B. Then, after the decomposition of the outer shell protein 10, two quantum dots (double dot) would be formed in the nano gap between source electrode 5/drain electrode 6.

Accordingly, in the modified example of this Embodiment, multiple dot formation between the fine electrodes can be controlled by adjusting the gap between the fine electrodes whereby enhancement of functions of SET can be realized although such control had been conventionally impossible.

EXAMPLE 2

In Example 2, a source electrode and a drain electrode constituted with a titanium thin film and a gold (Au) thin film were formed on the silicon substrate, and SET in which a cobalt quantum dot was selectively fixed in the nano gap between source/drain was produced. Example 2 is different from Example 1 merely in terms of the metal included in recombinant ferritin (fer-8) being cobalt, therefore, only a method of preparing ferritin including cobalt therein will be explained.

A solution of 0.5 mg/mL (1 µM) recombinant ferritin/100 mM Tris-HCl (pH 7.3-8.8) was prepared, and thereto was added 37.5 mM ammonium cobalt sulfate. While stirring the reaction solution with a magnetic stirrer, ammonium cobalt sulfate was added to give the final concentration of 2 to 5 mM, and further, an aqueous hydrogen peroxide solution was added thereto in an amount half the stoichiometric number of the ammonium cobalt sulfate. The reaction solution was stirred for 20 min, and thereafter, the temperature of the reaction solution was kept at 50° C., which was left to stand overnight.

The recombinant ferritin including the cobalt core formed therein was purified and recovered from the solution following the reaction by centrifugal separation and gel filtration. The centrifugal separation was carried out under a condition of 1,600 G for 10 min and 10,000 G for 30 min, and unnecessary portion other than ferritin was eliminated stepwise in the form of precipitates. The recombinant ferritin including the cobalt core formed therein was recovered in a pellet by ultracentrifugal separation at 230,000 G, for 1 hour from the finally yielded supernatant.

Thus resulting recombinant ferritin was subjected to gel filtration (column: TSK-GEL G4000 SWXL, PEEK/flow rate: 1 mL/min/buffer: 50 mM Tris-HCl (pH 8.0)+150 mM NaCl) using HPLC, and a peak of 24-mer (about 480 kDa) was fractionated. Thus fractionated recombinant ferritin solution was concentrated using an ultrafiltration membrane to obtain recombinant ferritin including a cobalt particle ($Co_3O_4$) therein (cobalt-including ferritin).

Using thus prepared cobalt-including ferritin, SET substrate was produced in a similar manner to Example 1.

Figure 9:
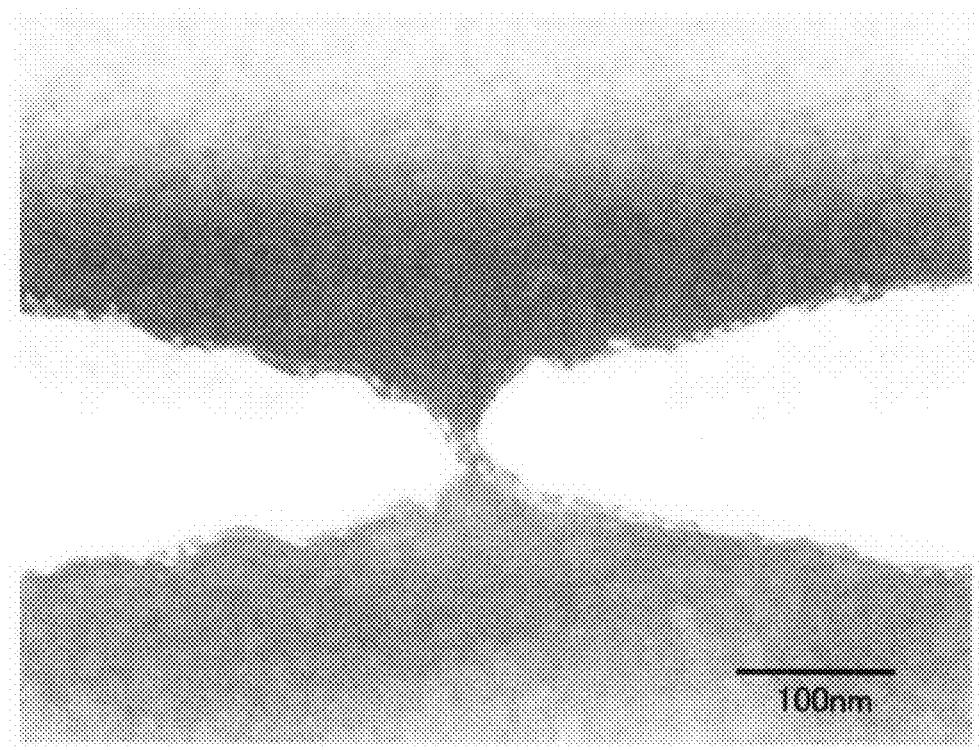
FIG. 9 shows an electron micrograph for illustrating around the source electrode and the drain electrode of the SET substrate obtained in Example 2.

An electron micrograph of the source electrode 28 and the drain electrode 29, and the vicinity thereof on the silicon substrate 1 following the ferritin decomposing step of Example 2 is shown in FIG. 9.

In FIG. 9, the cobalt quantum dot has been fixed on the lateral face of the source electrode on the left handside of the image, and of the drain electrode on the right handside of the image, but no cobalt quantum dot was present except for the side wall of the electrode in and around the nano gap between source/drain (about 20 nm).

Next, similarly to Example 1, setting of the gate electrode was made at 0 V, and the voltage between the source electrode and the drain electrode was changed in the range of from –0.6 V to +0.6 V, whereby alteration of the source electric current was measured. The measurement results are shown in FIG. 10.

Figure 10:
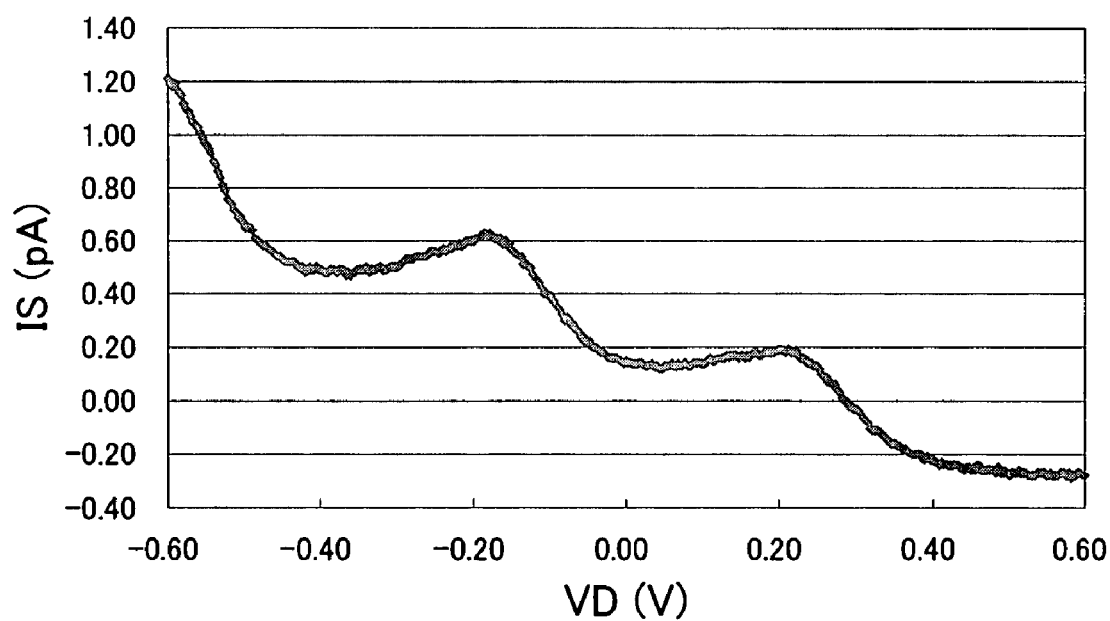
FIG. 10 shows a graph demonstrating the alteration of source electric current when the voltage between the source electrode and the drain electrode was changed on the SET substrate obtained in Example 2.

As is clear from FIG. 10, stepwise electric current-voltage characteristics were achieved, and probability of the substrate of Example 2 bearing a coulomb blockade effect was found. Thus, it was ascertained that the substrate of Example 2 functioned as SET. Moreover, it was also verified that the source electrode and the drain electrode were insulated in the element without any dot produced in a similar manner.

Although Tween 20 was used as a nonionic surfactant in Example 2, similar electric current-voltage characteristics were verified also on the SET substrate produced with use of Tween 80 at the same concentration.

Embodiment 2

Embodiment 2 of the present invention illustrates a method for production of SET having a side gate electrode. Basic structure of SET produced by this Embodiment is shown in FIGS. 12A to 12C.

In this SET, a side gate electrode 41 constituted with a material other than titanium is formed on the lateral side of the nano gap between the source electrode 5 and the drain electrode 6. Except for this constitution, this SET has the same structure as that of SET shown in FIGS. 1A to 1C. It is preferred that the side gate electrode 41 be provided away from the source electrode 5 and the drain electrode 6 farther than the distance of the nano gap between the source electrode 5 and the drain electrode 6.

A metal or semiconductor particle is selectively arranged and fixed as the quantum dot 8 at a center location of the nano gap between the source electrode 5 and the drain electrode 6, and unnecessary quantum dot is not present around the nano gap except for the side wall of the electrode.

Figure 12A:
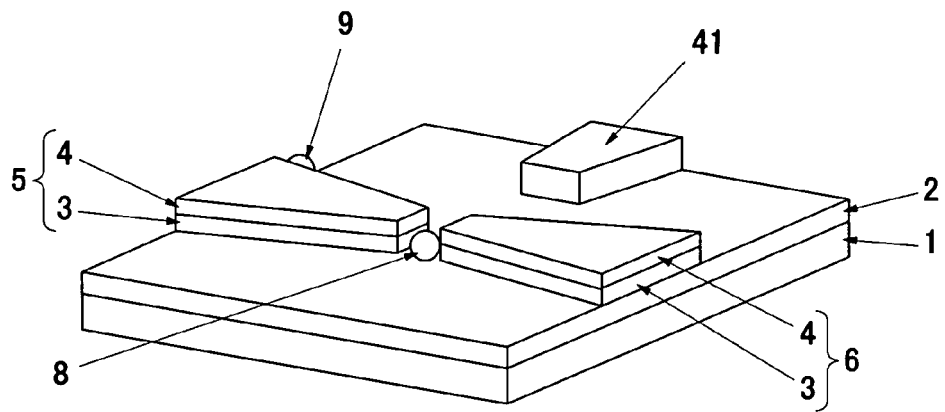
Figure 12B:
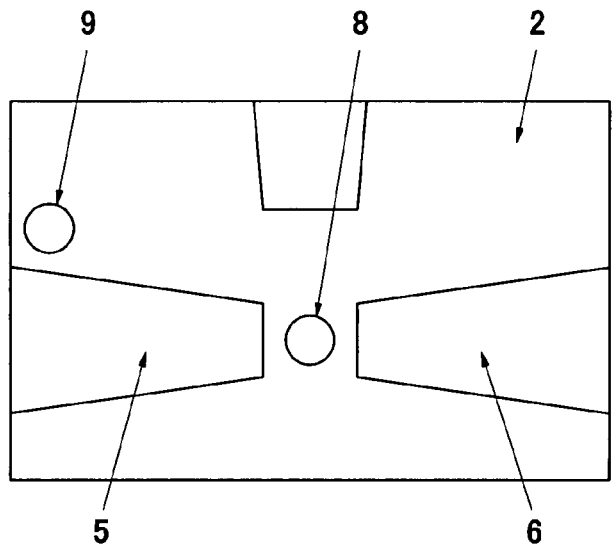
Figure 12C:
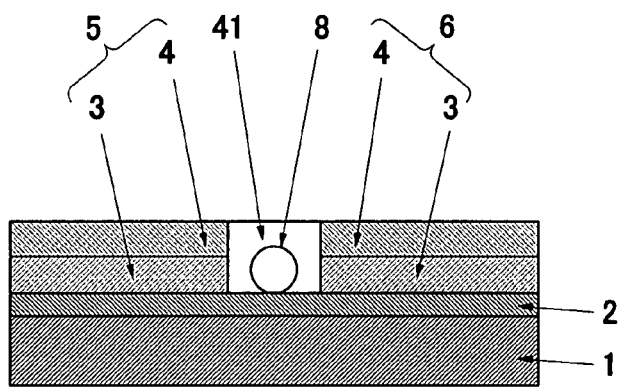

In SET shown in FIGS. 12A to 12C, the metal or semiconductor particle (lateral face quantum dot 9) is present also in the vicinity of the lateral face of the source electrode 5 or the drain electrode 6. However, because many of these are positioned away from the gap between source/drain, the charge is less likely to be trapped, and even though it happens to be trapped, less influence will be imparted on the operation point of SET.

SET of this Embodiment can be produced by a method for production similar to that of Embodiment 1. Moreover, modified examples similar to Embodiment 1 having electric characteristics similar to SETs of Example 1 and Example 2 may be also produced.

Embodiment 3

Embodiment 3 of the present invention illustrates a method for production of SET having a top gate electrode. Basic structure of SET produced by this Embodiment is shown in FIGS. 13A to 13C.

In this SET, the source electrode 5 and the drain electrode 6 on the first insulating layer 42 are covered by a second insulating layer 43, and on this second insulating layer 43 is formed a top gate electrode 44. The top gate electrode 44 is formed so as to be positioned above the nano gap between the source electrode 5 and the drain electrode 6, and therearound. Except for this constitution, this SET has the same structure as that of SET shown in FIGS. 1A to 1C.

A metal or semiconductor particle is selectively arranged and fixed as the quantum dot 8 at a center location of the nano gap between the source electrode 5 and the drain electrode 6, and unnecessary quantum dot is not present around the nano gap except for the side wall of the electrode.

Figure 13A:
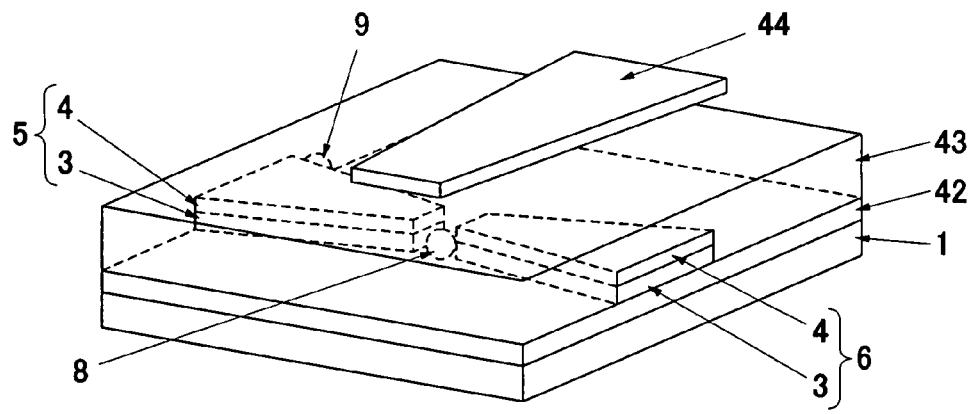
Figure 13B:
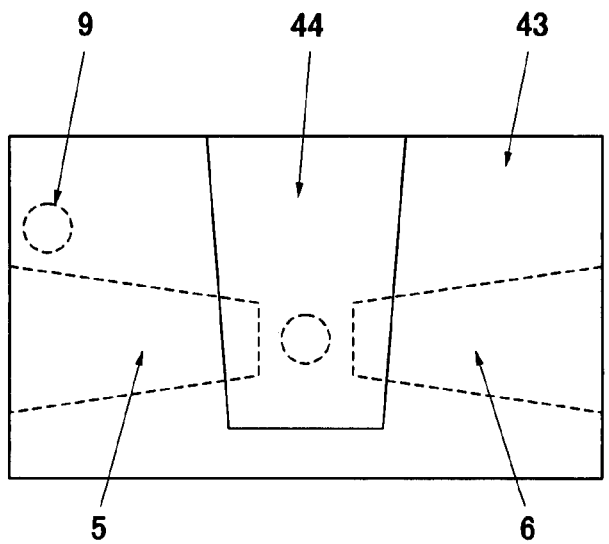
Figure 13C:
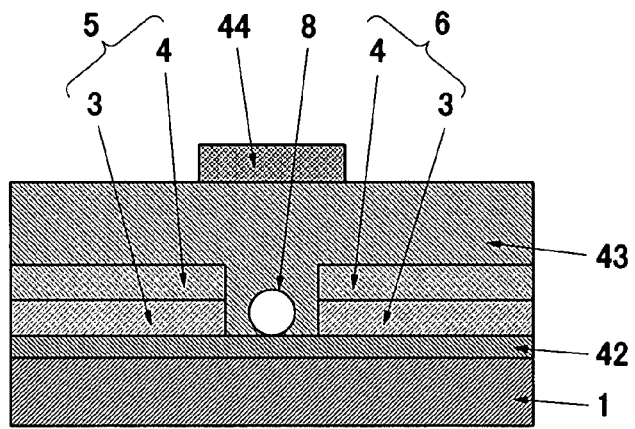
Figure 14A:
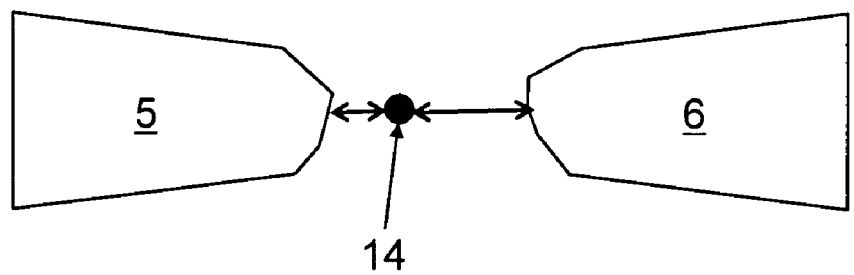
Figure 14B:
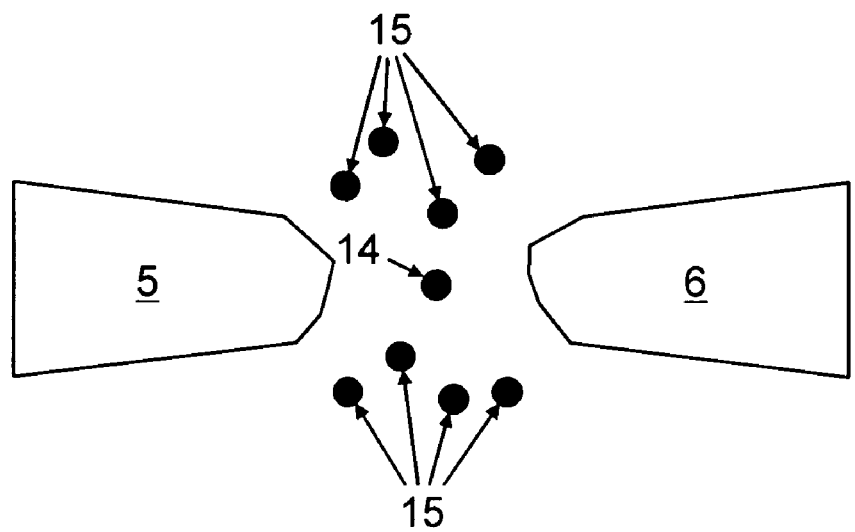
Figure 15:
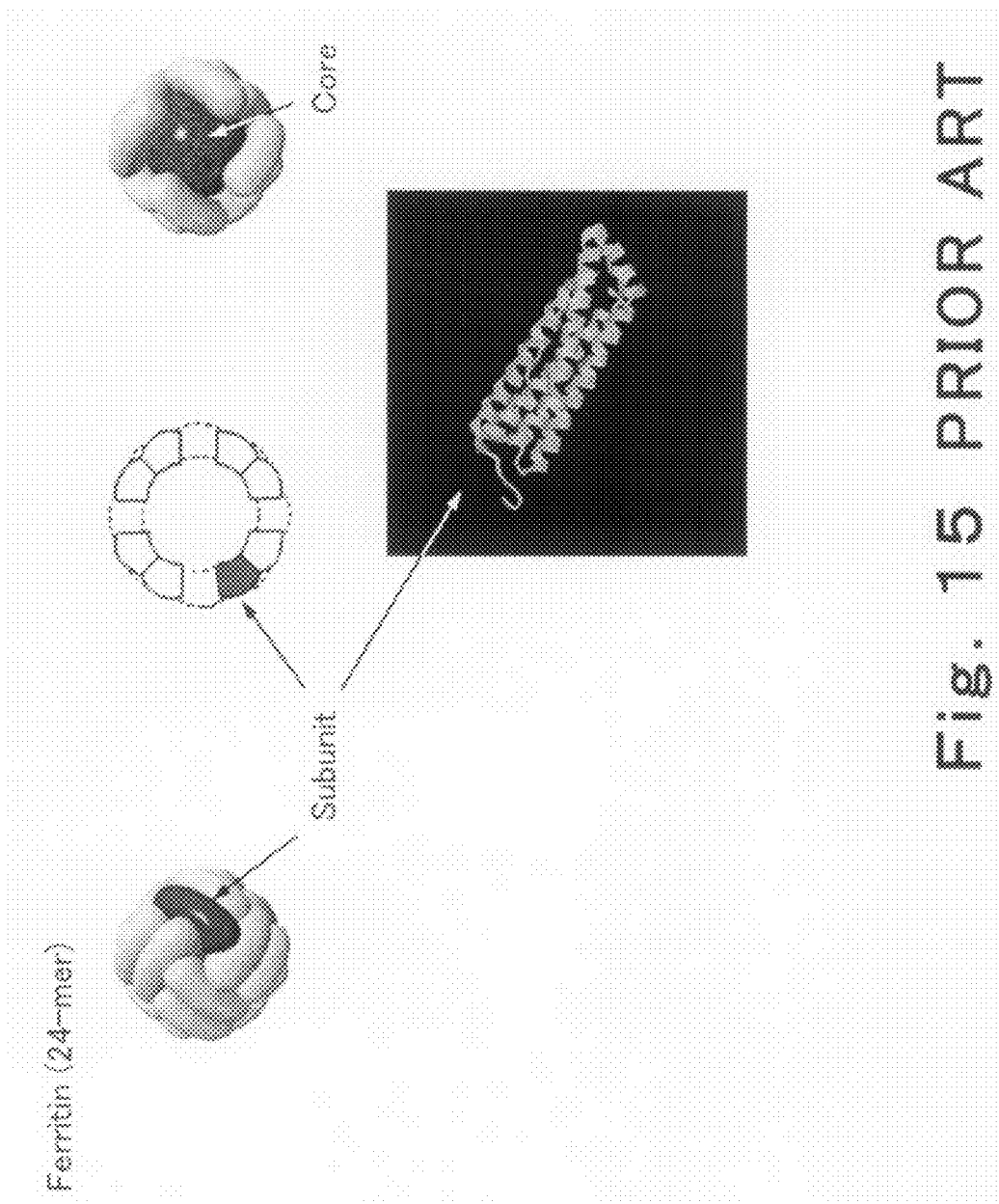
FIG. 15 shows a view illustrating the structure of ferritin.

Also in SET shown in FIGS. 13A to 13C, the metal or semiconductor particle (lateral face quantum dot 9) is present also in the vicinity of the lateral face of the source electrode 5 or the drain electrode 6. However, because many of these are positioned away from the gap between source/drain, the charge is less likely to be trapped, and even though it happens to be trapped, less influence will be imparted on the operation point of SET.

SET of this Embodiment can be produced by a method for production similar to that of Embodiment 1. Moreover, modified examples similar to Embodiment 1 having electric characteristics similar to SETs of Example 1 and Example 2 may be also produced.

From the foregoing description, many improvements and other embodiments of the present invention will be apparent to persons skilled in the art. Therefore, the foregoing description should be merely construed as illustration, which is provided for the purpose of teaching persons skilled in the art the best mode for carrying out the present invention. Details of the structure and/or function of the present invention can be substantially altered without departing from the spirit of the invention.

INDUSTRIAL APPLICABILITY

The method for production of a single electron semiconductor element of the present invention is useful as a method for production and the like of a single electron semiconductor element capable of conveniently and efficiently producing SET in which a quantum dot is selectively arranged in a nano gap between the fine electrodes.

The invention claimed is:

1. A method for production of a single electron semiconductor element,
    the semiconductor element comprising a substrate, a source electrode, a drain electrode, and a gate electrode, wherein
    a quantum dot is positioned between the source electrode and the drain electrode,
    the substrate has an insulating layer on the top face thereof,
    the substrate has the source electrode and the drain electrode, which are opposed, on the insulating layer,
    the source electrode and the drain electrode are provided with a titanium film, and a nontitanium metal film consisting of a metal other than titanium that covers the titanium film, respectively,
    said method for production comprising:
    a ferritin dropping step for dropping a solution containing ferritin including a metal or semiconductor particle therein, thereby allowing the ferritin to be selectively arranged between the source electrode and the drain electrode; and
    a ferritin decomposing step for decomposing the selectively arranged ferritin, thereby forming the quantum dot consisting of the metal or semiconductor particle between the source electrode and the drain electrode.

2. The method for production of a single electron semiconductor element according to claim 1 wherein the gate electrode is provided below the insulating layer between the source electrode and the drain electrode.

3. The method for production of a single electron semiconductor element according to claim 1 wherein the gate electrode is provided laterally to the gap between the source electrode and the drain electrode.

4. The method for production of a single electron semiconductor element according to claim 1 wherein the gate electrode is provided above the gap between the source electrode and the drain electrode.

5. The method for production of a single electron semiconductor element according to claim 4 wherein the insulating layer is a first insulating layer;
    a second insulating layer is provided that covers the top face of the substrate having the source electrode, the drain electrode and the quantum dot; and
    a gate electrode is provided on the second insulating layer.

6. The method for production of a single electron semiconductor element according to claim 1 wherein the metal other than titanium is gold.

7. The method for production of a single electron semiconductor element according to claim 1 wherein the nontitanium metal film has a thickness greater than the thickness of the titanium film.

8. The method for production of a single electron semiconductor element according to claim 1 wherein the solution containing ferritin including a metal or semiconductor particle therein further comprises a 0.01% vol/vol or more and 10% vol/vol or less nonionic surfactant in the ferritin dropping step.

9. The method for production of a single electron semiconductor element according to claim 1 which further comprises following the ferritin decomposing step a protection step for covering the semiconductor substrate surface on which the source electrode and the drain electrode were formed with an insulating layer for protection.

* * * * *